(12) United States Patent
Sullivan

(10) Patent No.: US 6,333,557 B1
(45) Date of Patent: Dec. 25, 2001

(54) SEMICONDUCTOR CHIP STRUCTURES WITH EMBEDDED THERMAL CONDUCTORS

(75) Inventor: Timothy D. Sullivan, Underhill, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/660,271

(22) Filed: Sep. 12, 2000

(51) Int. Cl.⁷ .......................... H01L 23/48; H01L 23/52; H01L 25/70
(52) U.S. Cl. .................. 257/758; 257/707; 438/622
(58) Field of Search .................. 257/758, 762, 257/765, 767, 771; 438/622, 629, 688, 122

(56) References Cited

U.S. PATENT DOCUMENTS

| | | |
|---|---|---|
| 5,117,276 * | 5/1992 | Thomas et al. . |
| 5,459,093 | 10/1995 | Kuroda et al. ........................ 437/51 |
| 5,598,026 | 1/1997 | Kapoor et al. ....................... 257/634 |
| 5,621,616 | 4/1997 | Owens et al. ........................ 361/704 |
| 5,744,865 * | 4/1998 | Jeng et al. . |
| 5,747,380 | 5/1998 | Yu et al. ............................... 438/599 |
| 5,789,313 | 8/1998 | Lee ....................................... 438/599 |
| 5,808,362 * | 9/1998 | Davies et al. . |
| 5,864,172 | 1/1999 | Kapoor et al. ....................... 257/634 |
| 5,955,781 * | 9/1999 | Joshi et al. . |
| 6,211,569 * | 4/2001 | Lou . |

* cited by examiner

Primary Examiner—Sheila V. Clark
(74) Attorney, Agent, or Firm—Lawrence R. Fraley, Esq.; Kevin P. Radigan, Esq.; Heslin Rothenberg Farley & Mesiti P.C.

(57) ABSTRACT

Semiconductor chip structures are provided with embedded thermal conductors for removing heat from one or more electrically conductive levels thereof, wherein the conductive levels are formed on a dielectric material having a low dielectric constant and low thermal conductivity. One or more cooling posts, e.g., multiple thermally conductive plugs are selectively disposed within the semiconductor chip structure adjacent to one or more electrically conductive levels and thermally coupled thereto so that heat produced by conductive lines within the wiring levels is transferred into and through the cooling posts for forwarding to a supporting substrate, which may have a back surface coupled to a cold plate, or to an upper surface of the semiconductor chip structure. The thermally conductive plugs of each cooling post have a second thermal conductivity, and the first thermal conductivity is less than the second thermal conductivity, for example, one third or less. As a specific example, the wiring levels may comprise copper, and the plurality of dielectric layers supporting the wiring levels may comprise a low k dielectric glass or nanofoam.

24 Claims, 4 Drawing Sheets

SEMICONDUCTOR CHIP STRUCTURES WITH EMBEDDED THERMAL CONDUCTORS

CROSS-REFERENCE TO RELATED APPLICATION

This application contains subject matter which is related to the subject matter of the following co-filed application, which is assigned to the same assignee as this application. The below-listed application is hereby incorporated herein by reference in its entirety:

"SEMICONDUCTOR CHIP STRUCTURES WITH EMBEDDED THERMAL CONDUCTORS AND A THERMAL SINK DISPOSED OVER OPPOSING SUBSTRATE SURFACES," by Armbrust el al., Ser. No. 09/660/270.

TECHNICAL FIELD

This invention relates in general to reducing heat energy in semiconductor devices, and more particularly, to thermal conductors embedded within semiconductor chip structures for removing heat from one or more conductive levels thereof, wherein the conductive levels are formed within or on a low k dielectric material having a low thermal conductivity. More specifically, the invention addresses the problem of removing heat generated by copper wiring within low k dielectric glasses and nanofoams in semiconductor chip structures.

BACKGROUND OF THE INVENTION

Modern Very Large Scale Integrated (VLSI) chips require cooling to improve reliability of their circuitry and interconnects, to increase their circuit switching performance, and to regulate thermally generated noise in their circuits. Cooling reduces the likelihood that a metal wire will form voids or a contact will become open. It also reduces the extent of time-dependent transistor mobility and threshold degradation which adversely affects circuit performance and operation. Furthermore, in typical complementary metal oxide semiconductor (CMOS) microprocessors, every reduction in temperature of 10° C. produces a 2% rise in operating frequency. For CMOS transistors, high temperatures yield significantly larger leakage currents, due to the thermal generation of carriers. This deleterious current doubles every 11° C. and is known to adversely affect the functional operation of dynamic and analog circuits.

As VLSI circuits shrink to improve performance and increase operating frequencies, higher amounts of heat are generated, for example, due to constant switching of these devices. The removal of heat within a semiconductor chip structure thus becomes a major obstacle to the efficient performance of the device. Therefore, a need continues to exist for enhanced heat removal techniques for semiconductor devices.

In addition to the continued reduction in chip size, new materials are being incorporated to increase circuit performance. For example, dielectric materials with a dielectric constant (k) lower than that of conventional oxide reduce the parasitic capacitance between neighboring conductors, thereby improving circuit speed. However, most low k dielectrics are also lower in density than silicon oxide, and exhibit lower thermal conductivities as well thus further increasing the need for enhanced heat removal techniques.

SUMMARY OF THE INVENTION

Forming conductive lines and vias for semiconductor connections can be accomplished by a variety of methods. Prior techniques have used deposition and subtractive etch of metal to form conductive lines, followed by deposition of a dielectric layer and etch of vias therein to connect conductive lines above and below the dielectric layer. Newer techniques include damascene and dual damascene processes. In these techniques, a dielectric is deposited and patterned with trenches for conductive lines (in a damascene process) and for lines and vias (in a dual damascene process). Metal is then deposited and any metal overlying the dielectric outside of the vias and the trenches is removed by a chemical mechanical polish (CMP).

The metal that has traditionally been employed in such processes is aluminum. However, today's chips are designed to run very fast and two effects limiting speed are conductive line resistance and RC coupling induced delay due to higher wiring density and closer spacing of conductive wires. Copper, which has a lower resistance, is replacing aluminum for wiring of semiconductor chip structures. RC coupling is being addressed by the use of lower dielectric constant (low k) dielectrics, such as porous silicas or polyimide nanofoams to replace conventional silicon dioxide dielectrics. However, the combination of copper and low k porous material creates a problem with heat dissipation. Because of the improved resistance and lower RC coupling that a copper/low k dielectric combination affords, more power per unit time is applied to the line, significantly increasing the heat dissipation requirements. These porous low k materials characteristically do not provide heat dissipation as well as high density glass dielectrics. Therefore, as the temperature of copper lines continues to increase due to current flow, resistance also increases, degrading device performance. To add to the problem, certain low k dielectrics, especially organic foam dielectrics, will degrade both structurally and electrically at temperatures around 350° C. This temperature has been observed to be exceeded in copper wires on some products. Thus, there is a need for techniques which may be integrated with copper/low k dielectric semiconductor interconnection structures to improve the heat dissipation capability thereof so that device performance may be maintained optimal and consistent.

To summarize, therefore, the present invention comprises in one aspect a semiconductor chip structure which includes a substrate and at least one electrically conductive level disposed above the substrate. The at least one conductive level resides on or within a dielectric material having a low dielectric constant and a first thermal conductivity. The semiconductor chip structure further includes at least one thermal conductor disposed adjacent to the at least one electrically conductive level and thermally coupled thereto so that heat produced by the at least one electrically conductive level is transferred into and through the at least one thermal conductor for forwarding to at least one of the substrate or an upper surface of the semiconductor chip structure; and wherein the at least one thermal conductor has a second thermal conductivity and the second thermal conductivity is greater than the first thermal conductivity.

In another aspect, a method of fabricating a semiconductor chip structure is presented which includes: providing a substrate; forming at least one electrically conductive level above the substrate on a dielectric layer, where the dielectric layer resides between the at least one electrically conductive level and the substrate, the dielectric layer comprising a dielectric material having a low dielectric constant and a low thermal conductivity; and disposing at least one thermal conductor adjacent to the at least one electrically conductive level and thermally coupled thereto so that heat produced by the at least one electrically conductive level during operation is transferred into the at least one thermal conductor for forwarding to at least one of the substrate or an upper surface of the semiconductor chip structure, wherein the at least one thermal conductor has a second thermal conductivity and the second thermal conductivity is greater than the low thermal conductivity of the dielectric material.

To restate, semiconductor chip structures are described herein having one or more integrated thermal conductors for dissipating heat generated by the conductive levels, for example wiring levels, above the substrates of the chip structures. Each thermal conductor can comprise a thermally conductive plug or a stack of plugs which facilitate thermal coupling of heat produced by one or more conductive levels to the substrate of the chip structure and/or an upper surface thereof. In one embodiment, the thermal conductors are placed in strategic locations within the semiconductor chip structures and either directly physically contact the conductive lines to be cooled or pass close thereto so as to be thermally coupled to the lines. As one example, the conductive lines reside on or within a first dielectric material having a first thermal conductivity and the stack of plugs comprise a second dielectric material having a second thermal conductivity, wherein the second thermal conductivity is at least 3× greater than the first thermal conductivity. More particularly, the present invention solves the problem of cooling semiconductor chip wiring when dielectrics having low thermal conductivity are used for interlevel isolation. The invention can be employed with a structure using copper wiring in combination with low k dielectric glasses and nanofoams.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The above objects, advantages and features of the present invention will be more readily understood from the following detail description of certain preferred embodiments of the invention, when considered in conjunction with the accompanying drawings in which:

BEST MODE FOR CARRYING OUT THE INVENTION

The present invention integrates one or more thermal conductors into a semiconductor chip structure for dissipating heat generated by conductive lines in the wiring levels of the chip structure. Each thermal conductor can comprise a thermally conductive plug or a stack of such plugs which facilitate thermal coupling of heat produced by one or more conductive lines to the substrate of the semiconductor chip structure and/or and the upper surface thereof, for example, to a thermally conductive bump. The thermal conductors are placed in strategic locations in the semiconductor chip structure and either directly physically contact the conductive lines to be cooled or pass close thereto so as to be thermally coupled to the lines. The thermal conductors conduct heat away from the conductive lines towards the substrate and/or to the upper surface of the semiconductor chip structure to enhance performance of the structure. Thermal conductors having high thermal conductivities are preferred and either can comprise a dielectric material or an electrically conductive material provided that the conductor or stack is electrically isolated within the device.

Figure 1:
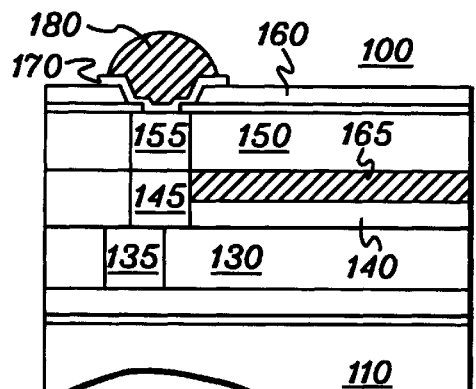
FIG. 1 is a cross-sectional elevational view of one embodiment of a semiconductor chip structure in accordance with the principles of the present invention.

Referring to FIG. 1, one embodiment of a semiconductor chip structure 100 in accordance with the present invention is shown. Structure 100 includes a cooling post comprising a stack of high k dielectric filled trenches/vias 135, 145 & 155, each making contact with an upper and/or lower member of the stack. (The various embodiments of these trenches/vias are also referred to herein as plugs.) In the middle of the stack, a line 165 to be cooled is shown abutting the high k dielectric filled trenches/vias 135, 145 & 155. Note that the alignment of the members from level to level is not critical. Further, note that the cooling post comprising the high thermal conductivity trenches/vias thermally couples line 165 to substrate 110 through one or more high k dielectric layers 120, which are optional. In addition, the cooling post couples line 165 to an upper surface of structure 100, that is, to an optional conductive bump 180 through pad limiting metallurgy 170. One fabrication embodiment of structure 100 is described below with reference to FIGS. 2–5.

Figure 2:
FIG. 2 is a cross-sectional elevational view of an intermediate structure attained during one fabrication embodiment of the semiconductor chip structure of FIG. 1.
Figure 3:
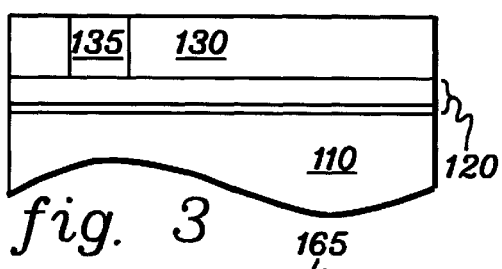
FIG. 3 is a cross-sectional elevational view of the structure of FIG. 2 after a high k dielectric plug has been formed in a low k dielectric isolation layer comprising the first wiring level.
Figure 4:
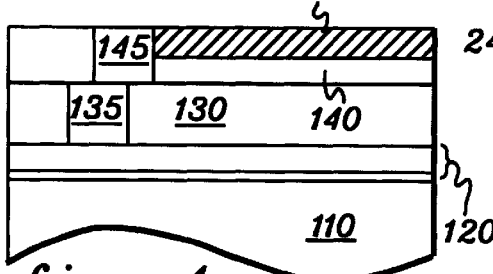
FIG. 4 is a cross-sectional elevational view of the structure of FIG. 3 after a high k dielectric plug has been formed in the low k dielectric isolation layer comprising the second wiring level and aligned to contact the conductive plug of the first wiring level.

In this embodiment (as well as the other depicted embodiments), three wiring levels 130, 140 & 150 are arbitrarily assumed to exist within the structure. In FIG. 2, one or more high k dielectric layers 120, which are thermally conductive, are formed on a substrate 110. In FIG. 3, a high k dielectric plug 135 is formed in a low k dielectric isolation layer 130 comprising the first wiring level. In FIG. 4, another high k dielectric plug 145 has been formed in a low k dielectric isolation layer 140 comprising the second wiring level which is shown to include a conductive line 165. This second high k dielectric plug is aligned to thermally contact plug 135 in the first wiring level. Thus, heat generated from line 165 is thermally coupled through plugs 145 and 135 and high thermal conductivity layers 120 to substrate 110.

Figure 5:
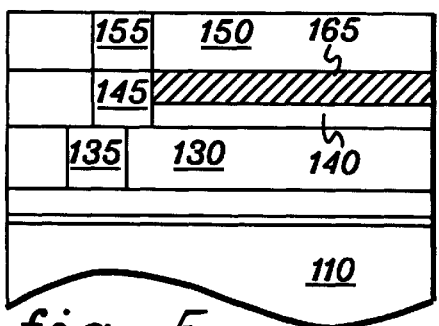
FIG. 5 is a cross-sectional elevational view of the structure of FIG. 4 after a high k dielectric plug has been formed in the low k dielectric isolation layer comprising the third wiring level and aligned to contact the high k dielectric plug of the second wiring level, wherein the structure of FIG. 1 is attained by passivation and formation of an optional conductive bump on top of the resultant cooling post defined by the conductive plugs.

In FIG. 5, a high k dielectric plug 155 has been formed in the low k dielectric isolation layer 150 comprising the third wiring level. This dielectric plug 155 is aligned to thermally contact high thermal conductivity plug 145 in the second wiring level so that a thermal conduction path is provided from line 165 to the upper surface of structure 100 (see FIG. 1). Structure 100 as shown in FIG. 1 is completed by adding a passivation layer 160 and an optional conductive bump 180, e.g., formed on top of the cooling post defined by plugs 135, 145 & 155, employing pad limiting metallurgy 170. In one example, bump 180 may comprise a Pb/Sn solder ball formed on top of the cooling post.

Figure 6:
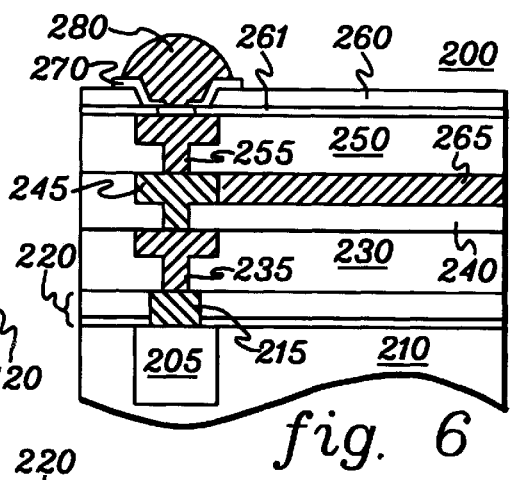
FIG. 6 is a cross-sectional elevation view of an alternate embodiment of a semiconductor chip structure in accordance with the principles of the present invention.

FIG. 6 depicts an alternative embodiment of a semiconductor chip structure 200 in accordance with the principles of the present invention. In this embodiment, a cooling post comprises a stack of metal filled trenches or vias 235, 245 & 255 (again referred to herein as plugs), each making thermal contact with at least one other plug in the stack. In the middle interconnect level, a line 265 to be cooled is shown abutting the thermally conductive trench/via stack. This stack of high thermal conductivity plugs thermally contacts substrate 210 through a conductive plug 215, for example, comprising tungsten, and a shallow or deep trench insulator 205, which electrically insulates the stack from substrate 210. Heat is also transferred to the upper surface of structure 200, for example, for dissipation through a conductive bump 280. In one example, the individual plugs of the cooling stack or post could comprise copper, aluminum, tungsten, or combinations of these metals with other metals. Although thermally conductive to both the substrate and the upper surface of the structure, the cooling post can be constructed to be electrically isolated from both the substrate and any other circuitry within the semiconductor chip structure 200. (For example, an insulation layer 261 can be provided electrically isolating plug 255 from bump 280.) FIGS. 7–10 depict one fabrication embodiment of structure 200.

Figure 7:
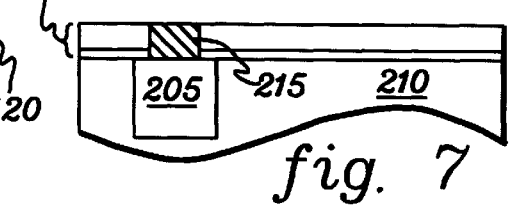
FIG. 7 is a cross-sectional elevational view of an intermediate structure attained during one fabrication embodiment of the semiconductor chip structure of FIG. 6.
Figure 8:
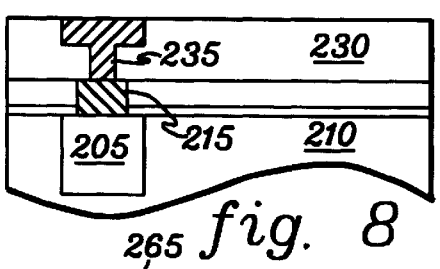
FIG. 8 is a cross-sectional elevational view of the structure of FIG. 7 after a dual damascene line/via plug has been formed in the low k dielectric isolation layer comprising the first wiring level.
Figure 9:
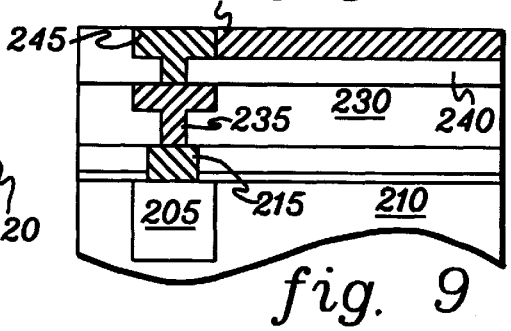
FIG. 9 is a cross-sectional elevational view of the structure of FIG. 8 after a dual damascene line/via plug has been formed in the low k dielectric isolation layer comprising the second wiring level and aligned to contact the plug in the first wiring level.
Figure 10:
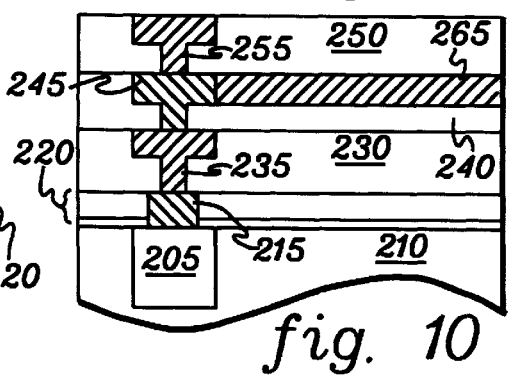
FIG. 10 is a cross-sectional elevational view of the structure of FIG. 9 after a dual damascene line/via plug has been formed in the low k dielectric isolation layer comprising the third wiring level and aligned to contact the plug in the second wiring level, wherein the semiconductor chip structure of FIG. 6 is attained after passivation and formation of an optional conductive bump on top of the resultant cooling post defined by the conductive plugs.

In FIG. 7, one or more high k dielectric layers 220, which are also highly thermally conductive, are formed on substrate 210, and a thermally conductive stud 215 has been formed therein over a deep trench isolation 205 in the substrate. In one embodiment, plug 215 may comprise a tungsten stud formed within the dielectric layers 220. This structure allows the cooling post to be formed electrically isolated from the substrate but still in good thermal contact therewith. In FIG. 8, a dual damascene line/via plug has been formed in the low k dielectric isolation layer 230 comprising the first wiring level. In FIG. 9, a dual damascene plug has been formed in the low k dielectric isolation layer 240 comprising the second wiring level aligned to contact plug 235 in the first wiring level. The second wiring level includes a conductive line 265 that is shown (by way of example) contacting plug 245. In FIG. 10, a dual damascene plug 255 has been formed in the low k dielectric isolation layer 250 comprising the third wiring level of the structure. This plug 255 is aligned to thermally contact the plug in the second wiring level. The final structure of FIG. 6 is attained by applying a passivation layer 260 and an optional conductive bump, such as a Pb/Sn solder ball formed on top of the cooling post using pad limiting metallurgy 270.

Figure 11:
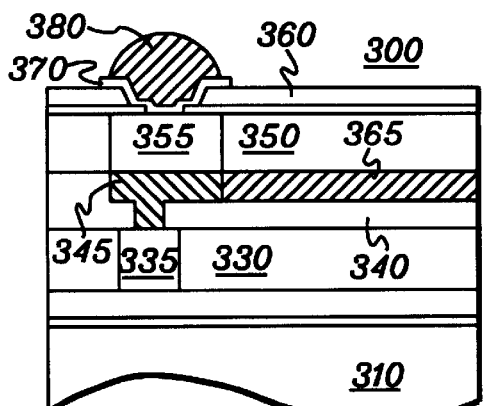
FIG. 11 is a cross-sectional elevational view of another embodiment of a semiconductor chip structure in accordance with the principles of the present invention.

FIG. 11 depicts another embodiment of a semiconductor chip structure 300 in accordance with the principles of the present invention. Structure 300 is again shown to include three wiring levels each embedded within a respective low k dielectric and low thermally conductive layer 330, 340 & 350. A cooling post is shown in this example to comprise an alternating stack of high k dielectric material and metal plugs each making thermal contact with at least one adjacent member of the cooling stack. In the middle interconnect level, a conductive line 365 to be cooled is shown abutting the metal trench/via comprising plug 345. (Although shown as a separate entity, plug 345 could alternatively be integrated into conductive line 365.) Note that the alignment of the members from level to level is again not critical, with the abutting of the conductive line 365 to the cooling post being only exemplary. The cooling post could be spaced from the conductive line provided that the cooling post is in good thermal contact with the line in order to remove heat generated within the line, e.g., to at least one of the substrate or the upper surface of the structure. FIGS. 12–15 depict one fabrication embodiment of structure 300.

Figure 12:
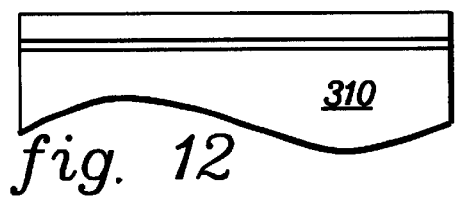
FIG. 12 is a cross-sectional elevational view of a structure attained during one fabrication embodiment of the semiconductor chip structure of FIG. 11.
Figure 13:
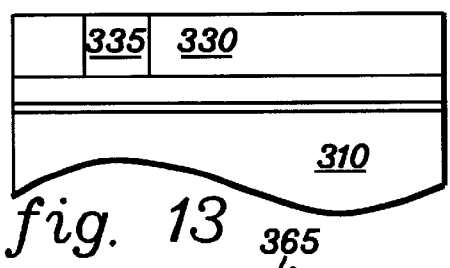
FIG. 13 is a cross-sectional elevational view of the structure of FIG. 12 after a high k dielectric plug has been formed in the low k dielectric isolation layer comprising a first wiring level.
Figure 14:
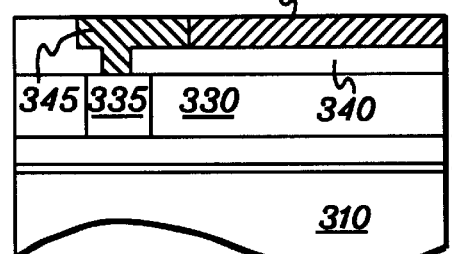
FIG. 14 is a cross-sectional elevational view of the structure of FIG. 13 after a dual damascene line/via plug has been formed in the low k dielectric layer comprising the second wiring level and aligned to contact the plug in the first wiring level.

In FIG. 12, one or more high k dielectric layers 320 have been formed on a substrate 310. In FIG. 13, a high k dielectric plug 335 has been formed in a low k dielectric isolation layer 330 comprising the first wiring level. In FIG. 14, a dual damascene plug 345 has been formed in the high k dielectric isolation layer 340 comprising the second wiring level. Plug 345 is aligned to thermally contact plug 335 in the first wiring level, and a conductive line 365 is shown to abut plug 345 in the second wiring level. A high k dielectric plug 355 is subsequently formed in the low k dielectric isolation layer 350 comprising the third wiring level. Plug 355 is aligned to thermally contact the conductive plug 345 of the second wiring level. Structure 300 is completed as shown in FIG. 11 by formation of a passivation layer 360 and an optional Pb/Sn solder ball 380 on top of the cooling post using pad limiting metallurgy 370.

Figure 16:
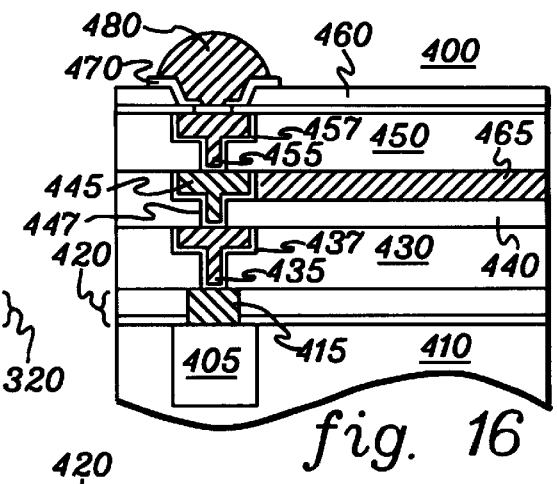
FIG. 16 is a cross-sectional elevational view of a further embodiment of a semiconductor chip structure in accordance with the principles of the present invention.

FIG. 16 depicts still another embodiment of a semiconductor chip structure 400 in accordance with the principles of the present invention. In this example, the cooling post comprises a stack of plugs each of which comprises a high k dielectric lined and metal filled trench/via that is electrically isolated from the others. Each plug makes thermal contact with at least one other plug in the cooling post. In the middle interconnect level, a line 465 to be cooled is shown abutting the high k dielectric liner 447 of the middle cooling plug. Again, alignment of the individual members of the cooling post from level to level is not critical provided that the plugs are thermally coupled to one another, and three wiring levels are depicted by way of example only.

Figure 17:
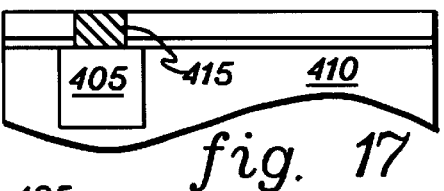
FIG. 17 is an intermediate structure attained during one fabrication embodiment of the semiconductor chip structure of FIG. 16.
Figure 18:
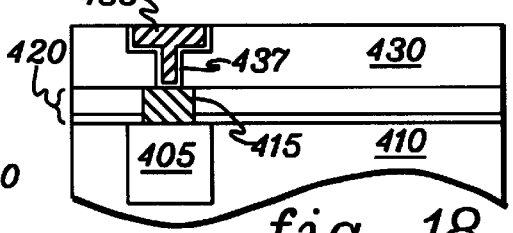
FIG. 18 is a cross-sectional elevational view of the structure of FIG. 17 after a dual damascene line/via plug having a high k dielectric liner and electrically conductive material has been formed in the low k dielectric isolation layer comprising the first wiring level and aligned to thermally contact a plug in the high k dielectric layer disposed over the substrate.
Figure 19:
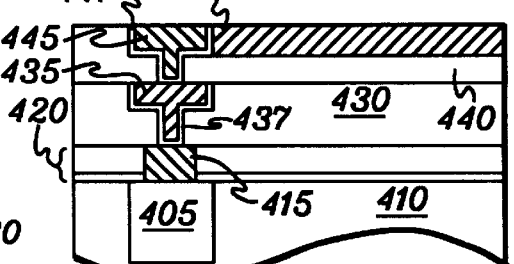
FIG. 19 is a cross-sectional elevational view of the structure of FIG. 18 after a dual damascene line/via plug having a high k dielectric liner and electrically conductive material has been formed in the low k dielectric isolation layer comprising the second wiring level and aligned to contact the plug in the first wiring level.
Figure 15:
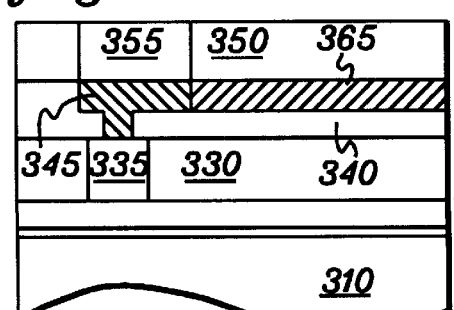
FIG. 15 is a cross-sectional elevational view of the structure of FIG. 14 after a high k dielectric plug has been formed in the low k dielectric isolation layer comprising the third wiring level and aligned to thermally couple to the plug in the second wiring level, wherein the structure of FIG. 11 is attained after passivation and formation of an optional conductive bump on top of the cooling post defined by the conductive plugs.
Figure 20:
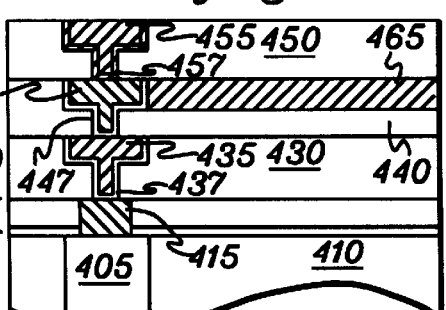
FIG. 20 is a cross-sectional elevational view of the structure of FIG. 19 after a dual damascene line/via plug having a high k dielectric liner and electrically conductive material has been formed in the low k dielectric isolation layer comprising the third wiring level and aligned to contact the plug in the second wiring level, wherein the structure of FIG. 16 is attained after passivation and formation of an optional conductive bump on top of the cooling post defined by the thermally conductive plugs.

In FIG. 17, one or more high k dielectric layers 420 have been formed on a substrate 410 with an optional highly conductive plug 415, for example, a tungsten stud, formed in the dielectric layers over a deep trench isolation 405. Isolation 405 electrically isolates the cooling post to be fabricated from substrate 410 and provides good thermal conduction therebetween. In FIG. 18, a dual damascene plug 435 with a high k dielectric liner 437 has been formed in the low k isolation layer 430 comprising the first wiring level. In FIG. 19, a dual damascene plug 445 has been formed with a high k dielectric liner 447 in the low k dielectric isolation layer 440 comprising the second wiring level. Plug 445 is aligned to thermally contact plug 435 in the first wiring level and is disposed adjacent to a conductive line 465 to be cooled of the second wiring level. In FIG. 20, a dual damascene plug 455 has been formed in the low k dielectric isolation layer 450 comprising the third wiring level, again with a high k dielectric liner 457. Plug 455 is aligned to thermally contact plug 445 of the second wiring level. The completed structure 400 is shown in FIG. 16 after passivation layer 460 has been formed and an optional conductive bump 480, such as a Pb/Sn solder ball, has been formed on top of pad limiting metallurgy 470 aligned over the cooling post defined by the thermally interconnected plugs.

Figure 21:
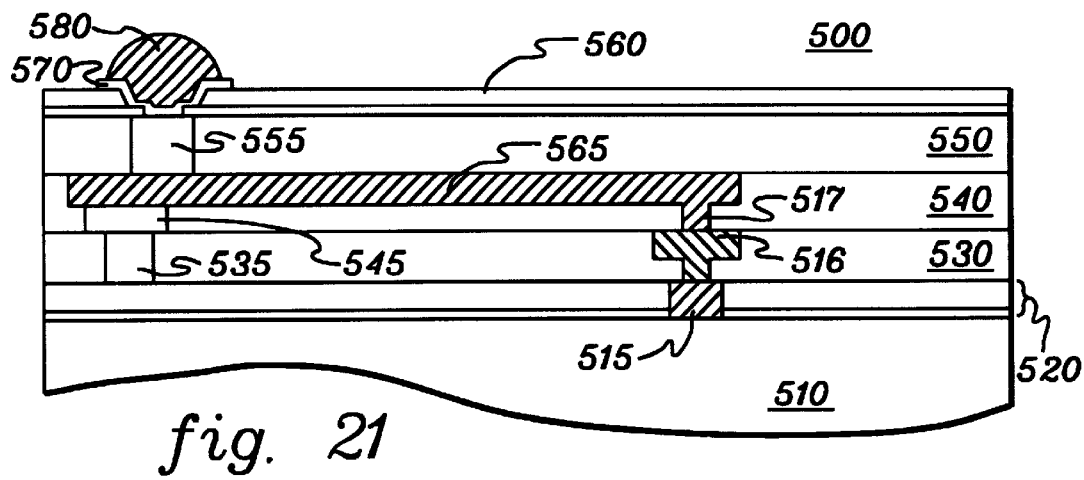
FIG. 21 is a cross-sectional view of still another embodiment of a semiconductor chip structure in accordance with the principles of the present invention.

Still another embodiment of a semiconductor chip structure 500 in accordance with the present invention is depicted in FIG. 21. In this embodiment, multiple cooling plugs are employed, which in one example comprise a plurality of high k dielectric plugs thermally coupling, for example, a conductive line 565 of the second wiring level to high k dielectric layers 520 residing on substrate 510 and to an upper surface of structure 500. In addition, multiple dual damascene conductive studs are aligned over, for example, a tungsten stud 515 which may be electrically connected to a device in substrate 510. FIGS. 22–25 depict one embodiment for fabricating structure 500 of FIG. 21.

Figure 22:
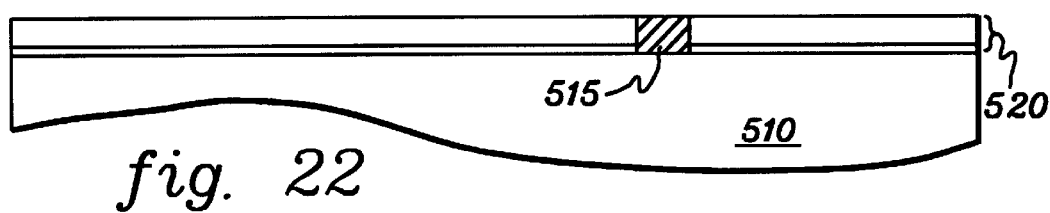
FIG. 22 is a cross-sectional elevational view of an intermediate structure attained during one fabrication embodiment of the structure of FIG. 21.
Figure 23:
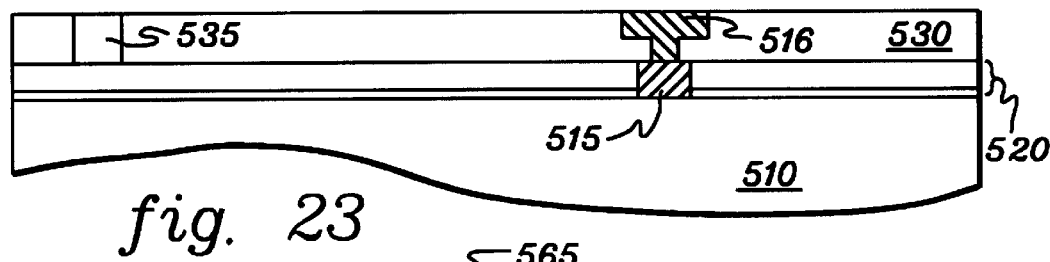
FIG. 23 is a cross-sectional elevational view of the structure of FIG. 21 after a high k dielectric stud and a dual damascene signal line contacting a tungsten stud have been formed in the low k dielectric isolation layer comprising the first wiring level.
Figure 24:
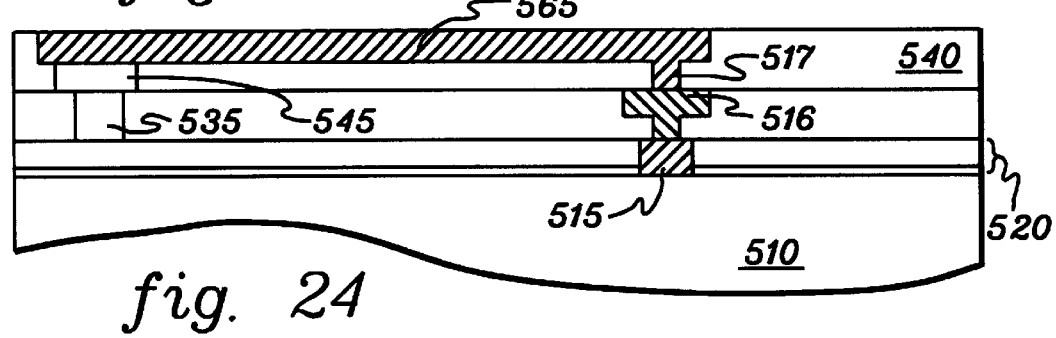
FIG. 24 is a cross-sectional elevational view of the structure of FIG. 23 after a thin high k dielectric plug has been formed in the low k dielectric isolation layer comprising the second wiring level and aligned to contact the high k dielectric stud of the first wiring level, and a via/signal line has been formed in electrical contact with the first wiring level.
Figure 25:
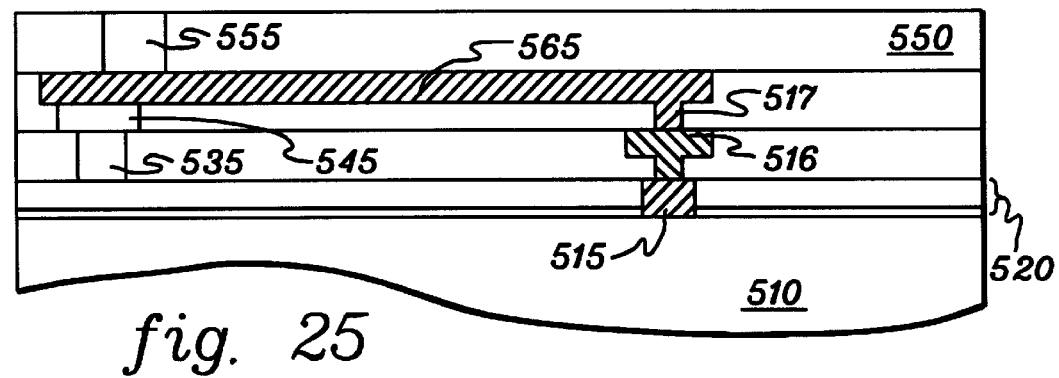
FIG. 25 is a cross-sectional elevational view of the structure of FIG. 24 after a high k dielectric plug has been formed in the low k dielectric isolation layer comprising the third wiring level and aligned to contact the signal line in the second wiring level, wherein the structure of FIG. 21 is attained after passivation and formation of an optional conductive bump on top of the cooling post defined by the thermally conductive plugs.

In FIG. 22, one or more high k dielectric layers 520 have been formed on substrate 510 and an optional tungsten stud 515 has been formed in high k dielectric layers 520 for electrically and/or thermally connecting an active signal line 565 to the substrate. In FIG. 23, a high k dielectric plug 535 and a dual damascene plug 516, contacting the tungsten stud 515, have been formed in a low k dielectric isolation layer 530 comprising the first wiring level. In FIG. 24, a high k dielectric plug 545 has been formed in the low k dielectric isolation layer 540 comprising the second wiring level aligned to contact high k dielectric plug 535 in the first wiring level. Also formed in this wiring level is a conductive line 565 in electrical contact with the first level wiring and extending over dielectric plug 545. This provides thermal contact to the cooling post and hence to substrate 510. A second dual damascene plug 517 electrically and thermally connects line 565 to plug 516 in the first wiring level. In FIG. 25, a high k dielectric plug 555 is formed in the low k dielectric isolation layer 550 comprising the third wiring level and is aligned to thermally couple to conductive line 565 of the second wiring level, thereby thermally coupling the conductive line to the upper surface of structure 500. As shown in FIG. 21, structure 500 is completed by forming a passivation layer 560 and an optional conductive bump 580 on top of the cooling post via pad limiting metallurgy 570.

Figure 26:
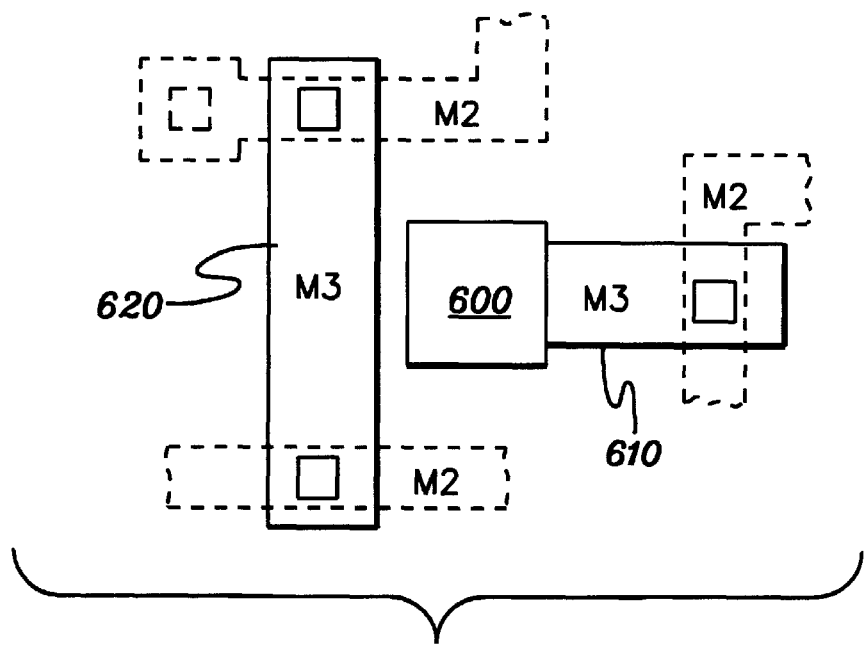
FIG. 26 is a plan view of a portion of a semiconductor chip structure showing two wiring levels and employing a cooling post in accordance with the principles in the present invention.
Figure 27:
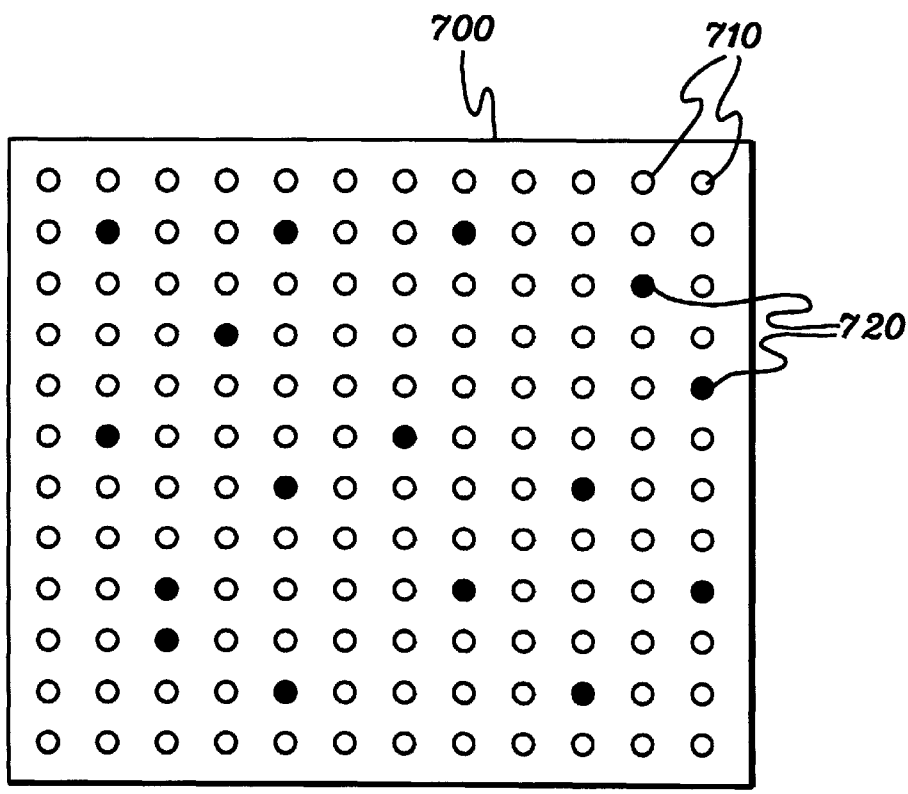
FIG. 27 is a plan view of a semiconductor chip structure showing conductive bump locations, with dummy locations shaded solid which in one embodiment may be thermally coupled to cooling posts fabricated in accordance with the principles of the present invention.

In FIG. 26, a top view of a portion of a semiconductor chip structure in accordance with the present invention is shown wherein a cooling post 600 is disposed in physical contact with a first conductive line 610 in the third wiring level (M3) of the structure, and adjacent to a second conductive line 620 in the same wiring level. The cooling post is preferably disposed so as to thermally couple to both conductive lines 610 and 620. Additionally, as shown, the cooling post could thermally couple to one or more other conductive lines, for example in the second wiring level (M2). FIG. 27 depicts one embodiment of an upper surface of a semiconductor chip structure in accordance with the principles of the present invention wherein an array of conductive bumps, such as Pb/Sn solder balls are disposed across the surface. The "dummy" locations of thermally conductive bumps 720 are shaded solid (i.e., those bumps disposed atop cooling posts), while the actual electrically conductive bumps 710 are shown open.

Those skilled in the art will note from the above discussion that each wiring level of the three wiring levels depicted in the various embodiments of FIGS. 1–25 is assumed to comprise conductive lines embedded within the respective low k dielectric layers. The cooling posts depicted in the various embodiments can be thermally coupled to one or more of the conductive levels, and in particular, to the conductive lines within one or more of the levels. Use of the cooling posts presented herein depends upon the particular architecture of a given semiconductor chip structure.

Further, by way of example, the high k dielectric layers discussed herein may have a dielectric constant $\geq 3.5$, with a typical value being $\geq 4$, and the low k dielectric layers presented may have a dielectric constant below 3.5, with a typical range being 2.5–2.7. A low k dielectric layer as discussed herein is assumed to comprise a low thermal conductivity layer, while a high k dielectric layer is assumed to comprise a highly thermally conductive layer. By way of example, the thermally conductive plugs described herein preferably have greater than 3 times the thermal conductivity of the adjacent low k dielectric layers, with the thermal conductivity typically being $\geq 4\times$ that of the low k dielectric layers. As specific examples, the low k dielectric layers may comprise silsesquioxanes, while the high k dielectric layers could comprise silicon nitride or silicon dioxide.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A semiconductor chip structure comprising:
  a substrate;
  at least one electrically conductive level disposed above said substrate, said at least one electrically conductive level residing at least partially on a dielectric material having a low dielectric constant and a first thermal conductivity, wherein said dielectric material resides between said at least one electrically conductive level and said substrate; and
  at least one thermal conductor disposed adjacent to said at least one electrically conductive level and thermally coupled thereto such that heat produced by said at least one electrically conductive level during operation is transferred into the at least one thermal conductor for forwarding to at least one of said substrate or an upper surface of said semiconductor chip structure, wherein said at least one thermal conductor has a second thermal conductivity and said second thermal conductivity is greater than said first thermal conductivity.

2. The semiconductor chip structure of claim 1, wherein said dielectric material comprises a first dielectric material, and wherein said at least one thermal conductor comprises a second dielectric material, said second dielectric material having a high dielectric constant.

3. The semiconductor chip structure of claim 2, wherein said first dielectric material has a dielectric constant below 3.5, and said second dielectric material has a dielectric constant above 3.5.

4. The semiconductor chip structure of claim 2, wherein said first thermal conductivity is less than $\frac{1}{3}$ said second thermal conductivity.

5. The semiconductor chip structure of claim 1, wherein said at least one thermal conductor comprises at least one thermally conductive plug disposed adjacent to said at least one electrically conductive level, said at least one thermally conductive plug removing heat from said at least one electrically conductive level for forwarding to at least one of said substrate or an upper surface of said semiconductor chip structure.

6. The semiconductor chip structure of claim 5, wherein said at least one thermally conductive plug transfers heat from said at least one electrically conductive level for forwarding to both said substrate and said upper surface of said semiconductor chip structure.

7. The semiconductor chip structure of claim 6, wherein said at least one thermally conductive plug couples transferred heat to at least one thermally conductive bump disposed at said upper surface of said semiconductor chip structure.

8. The semiconductor chip structure of claim 5, wherein said dielectric material comprises a first dielectric material, and wherein said at least one thermally conductive plug comprises at least one of a second dielectric material or an electrically conductive material, said at least one thermally conductive plug being electrically isolated within said semiconductor chip structure.

9. The semiconductor chip structure of claim 8, wherein said electrically conductive material comprises copper, and said at least one electrically conductive level comprises at least one wiring level, said at least one wiring level also comprising copper.

10. The semiconductor chip structure of claim 8, wherein said at least one thermally conductive plug comprises multiple thermally conductive plugs, at least one plug of said multiple thermally conductive plugs comprising said second dielectric material.

11. The semiconductor chip structure of claim 10, wherein at least one plug of said multiple thermally conductive plugs comprises said electrically conductive material.

12. The semiconductor chip structure of claim 8, wherein said at least one thermally conductive plug comprises multiple thermally conductive plugs, and wherein at least one plug of said multiple thermally conductive plugs comprises both said second dielectric material and said electrically conductive material, wherein said second dielectric material at least partially surrounds and electrically isolates said electrically conductive material within said at least one plug.

13. The semiconductor chip structure of claim 1, wherein said at least one conductive level comprises a plurality of wiring levels disposed above said substrate, and wherein said at least one thermal conductor is disposed adjacent to and thermally coupled to conductive lines in at least some wiring levels of said plurality of wiring levels for removing heat produced by said conductive lines of said at least some wiring levels for forwarding to said at least one of said substrate or said upper surface of said semiconductor chip structure.

14. The semiconductor chip structure of claim 13, wherein each wiring level of said plurality of wiring levels resides on a different dielectric layer, each dielectric layer comprising said dielectric material having said first thermal conductivity.

15. The semiconductor chip structure of claim 14, wherein said at least one thermal conductor comprises at least one cooling post, said at least one cooling post comprising at least one conductive plug disposed adjacent to said conductive lines of said at least some wiring levels.

16. The semiconductor chip structure of claim 15, wherein said at least one cooling post is electrically isolated within said semiconductor chip structure, and comprises a second dielectric material, said second dielectric material having a high dielectric constant.

17. A method of fabricating a semiconductor chip structure, said method comprising:
  providing a substrate;
  forming at least one electrically conductive level above said substrate on a dielectric layer, wherein said dielectric layer resides between said at least one electrically conductive level and said substrate, said dielectric layer comprising a dielectric material having a low dielectric constant and a first thermal conductivity; and
  disposing at least one thermal conductor adjacent to the at least one electrically conductive level and thermally coupled thereto so that heat produced by the at least one electrically conductive level during operation is transferred into the at least one thermal conductor for forwarding to at least one of said substrate or an upper surface of said semiconductor chip structure, wherein the at least one thermal conductor has a second thermal conductivity and said second thermal conductivity is greater than said first thermal conductivity.

18. The method of claim 17, further comprising forming said dielectric layer above said substrate and subsequent thereto disposing said at least one thermal conductor at least partially within said dielectric layer and adjacent to said at least one electrically conductive level to be formed on said dielectric layer.

19. The method of claim 18, wherein said dielectric material comprises a first dielectric material, and wherein said at least thermal conductor comprises a second dielectric material, said second dielectric material having a high dielectric constant, and wherein said first thermal conductivity is less than $1/3$ said second thermal conductivity.

20. The method of claim 18, wherein said forming said dielectric layer comprises forming said dielectric layer from at least one of a dielectric glass or a nanofoam.

21. The method of claim 17, wherein said forming at least one electrically conductive level comprises forming multiple electrically conductive levels above said substrate, each electrically conductive level being formed on a different dielectric layer, each dielectric layer comprising said dielectric material having said low dielectric constant and said first thermal conductivity, and wherein said disposing comprises disposing at least one cooling post in thermal contact with at least one electrically conductive level of said multiple electrically conductive levels so that heat produced by said at least one electrically conductive level during operation is transferred into the at least one cooling post for forwarding to said at least one of said substrate or said upper surface of said semiconductor chip structure.

22. The method of claim 21, wherein said disposing comprises fabricating said cooling post from a plurality of thermally conductive plugs, each plug of said plurality of thermally conductive plugs being disposed in a different dielectric layer of said dielectric layers supporting said multiple conductive levels.

23. The method of claim 22, wherein each thermally conductive plug comprises at least one of a second dielectric material or an electrically conductive material, and wherein said at least one cooling post is electrically isolated within said semiconductor chip structure.

24. The method of claim 23, wherein at least one thermally conductive plug of said multiple thermally conductive plugs comprises both said second dielectric material and said electrically conductive material, with said second dielectric material at least partially surrounding and electrically isolating said electrically conductive material.

\* \* \* \* \*